(12) United States Patent
DeVries et al.

(10) Patent No.: US 9,059,490 B2
(45) Date of Patent: Jun. 16, 2015

(54) 60 GHZ INTEGRATED CIRCUIT TO PRINTED CIRCUIT BOARD TRANSITIONS

(71) Applicant: BLACKBERRY LIMITED, Waterloo (CA)

(72) Inventors: Christopher Andrew DeVries, St. Thomas (CA); Houssam Kanj, Waterloo (CA); Morris Repeta, Ottawa (CA); Huanhuan Gu, Kitchener (CA)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

(21) Appl. No.: 14/048,603

(22) Filed: Oct. 8, 2013

(65) Prior Publication Data

US 2015/0097633 A1  Apr. 9, 2015

(51) Int. Cl.
| | |
|---|---|
| *H03H 7/38* | (2006.01) |
| *H01P 3/08* | (2006.01) |
| *H01P 3/00* | (2006.01) |
| *H01P 1/04* | (2006.01) |

(52) U.S. Cl.
CPC ............ *H01P 3/08* (2013.01); *H01P 3/003* (2013.01); *H01P 1/042* (2013.01); *H03H 7/38* (2013.01)

(58) Field of Classification Search
None
See application file for complete search history.

(56) References Cited

U.S. PATENT DOCUMENTS

| | | | |
|---|---|---|---|
| 4,260,946 A | 4/1981 | Wheatley, Jr. | |
| 4,260,964 A | 4/1981 | Saul | |
| 5,272,600 A * | 12/1993 | Carey | 361/792 |
| 6,400,234 B1 | 6/2002 | Ohhashi et al. | |
| 2003/0150641 A1 * | 8/2003 | Kinayman et al. | 174/255 |
| 2003/0151133 A1 | 8/2003 | Kinayman et al. | |
| 2006/0226928 A1 | 10/2006 | Henning et al. | |
| 2008/0291115 A1 | 11/2008 | Doan et al. | |
| 2010/0019859 A1 * | 1/2010 | Lascari | 333/33 |
| 2010/0085130 A1 * | 4/2010 | Margomenos | 333/33 |
| 2011/0170268 A1 * | 7/2011 | Takemura et al. | 361/748 |
| 2011/0241794 A1 | 10/2011 | Pao et al. | |
| 2012/0153969 A1 | 6/2012 | Eckert et al. | |
| 2013/0049880 A1 | 2/2013 | Oh et al. | |
| 2013/0194754 A1 * | 8/2013 | Jung et al. | 361/720 |
| 2013/0207274 A1 * | 8/2013 | Liu et al. | 257/774 |
| 2013/0235542 A1 | 9/2013 | Song et al. | |

(Continued)

FOREIGN PATENT DOCUMENTS

| | | |
|---|---|---|
| DE | 10345218 B3 | 12/2004 |
| DE | 112009001891 T | 7/2011 |
| EP | 0525810 A1 | 2/1993 |

(Continued)

OTHER PUBLICATIONS

Deslandes, Dominic et al, "Integrated Microstrip and Rectangular Waveguide in Planar Form", IEEE Microwave and Wireless Components Letters, vol. 11, No. 2, Feb. 2001, pp. 68-70.

(Continued)

*Primary Examiner* — Tuan T Lam
(74) *Attorney, Agent, or Firm* — Conley Rose, P.C.; J. Robert Brown, Jr.

(57) ABSTRACT

Embodiments are directed to a transition structure for interfacing an integrated circuit chip and a substrate, comprising: a co-planar waveguide (CPW) structure formed based on ground-signal-ground (GSG) pads on the integrated circuit chip, a grounded co-planar waveguide (CPWG) structure coupled to the GSG pads, and a microstrip coupled to the CPWG structure.

13 Claims, 15 Drawing Sheets

(56) References Cited

U.S. PATENT DOCUMENTS

| | | | | |
|---|---|---|---|---|
| 2013/0342280 | A1* | 12/2013 | Blanton et al. | 333/33 |
| 2014/0145883 | A1* | 5/2014 | Baks et al. | 343/700 MS |

FOREIGN PATENT DOCUMENTS

| | | |
|---|---|---|
| EP | 2120288 A1 | 11/2009 |
| EP | 2224535 A1 | 1/2010 |
| FR | 2953651 A1 | 10/2011 |
| WO | 9843314 A1 | 10/1998 |

OTHER PUBLICATIONS

European Search Report, Application No. 13165524.3-1811, Mailed on Nov. 22, 2013.

R.E. Amaya, "A broadband 3D vertical Microstrip to Stripline transition in LTCC using a quasi-coaxial structure for millimetre-wave SOP applications", IEEE Xplore Digital Library, Microwave Conference, Abstract Only, Sep. 28-30, 2010.

Bozzi, M., et al.; "Review of Substrate-Integrated Waveguide Circuits and Antennas"; IET Microwaves, Antennas & Propagation; vol. 5, issue 8; p. 909-920; 2011.

Constantinescu, Stefan; "Panasonic Shoves WiGig Inside Mobile Phones, Expect Multi Gigabit Per Second Transfer Speeds"; retrieved from http://www.intomobile.com/2011/06/06/panasonic-shoves-wigig-inside-mobile-phones-expect-multi-gigabit-per-second-transfer-speeds/ on May 30, 2013; Jun. 6, 2011, 6 pages.

Deslandes, Dominic; "Accurate Modeling, Wave Mechanisms, and Design Considerations of a Substrate Integrated Waveguide"; IEEE Transactions on Microwave Theory and Techniques; vol. 54; No. 6; Jun. 2006, pp. 2516-2526.

Ding, Yan; "Miniaturization Techniques of Substrate Integrated Waveguide Based on Multilayered Printed Circuit Board Platform"; Diss. Ecole Polytechnique de Montreal; p. 1-177; Oct. 2011.

Gordon Klaric Felic and Efstratios Skafidas, "Integration of 60-GHz Microstrip Antennas with CMOS Chip", Ch 20 from Microstrip Antennas published Apr. 2011, InTech, 17 pages.

Felic, G., "A microstrip antenna with flip-chip interconnect for millimetre wave transceiver on CMOS", http://ieeexplore.ieee.org/xpl/articleDetails.jsp?arnumber=4619751 accessed Sep. 17, 2013, 1 pages.

Jeffrey M. Gilbert, Chinh H. Doan, Sohrab Emami, C. Bernard Shung, "Wireless Panel Architecture using Lossless Uncompressed 60 GHz Transmissions", ISSCC 2009, pp. 1-4.

J. R. James and P. S. Hall, "Handbook of Microstrip Antennas". London, U.K.: Peregrinus, 1989, 15 pgs.

Kam et al. "LTCC Packages With Embedded Phased-Array Antennas for 60 GHz Communications" IEEE Microwave and Wireless Components Letters, vol. 21, No. 3, Mar. 2011 , p. 142-144.

Koh, Chris; "The Benefits of 60 GHz Unlicensed Wireless Communications"; YDI Wireless Whitepaper; p. 1-7; 2002.

Kordiboroujeni, Zamzam, et al.; "Efficient Mode-Matching Design of Substrate-Integrated Waveguide Filters"; Proceedings of the 42nd European Microwave Conference; p. 253-256; Oct. 29-Nov. 12, 2012.

Antti Lamminen and Jussi Säily, "Wideband Millimetre Wave End-Fire Antenna and Array for Wireless Short-Range Applications", Antennas and Propagation (EuCAP), 2010 Proceedings of the Fourth European Conference, 5 pages.

Young Chul Lee, Member, IEEE, and Chul Soon Park, "A Compact and Low-Radiation CPW Probe Pad Using CBCPW-to-Microstrip Transitions for V-Band LTCC Applications", IEEE Transactions on Advanced Packaging, vol. 30, No. 3, Aug. 2007, pp. 566-569.

Liu, Changjun, et al.; "A Compact Substrate Integrated Waveguide Band-pass Filter"; IEEE Transactions on Microwave Theory and Techniques; vol. 54, No. 6; p. 2516-2526; Jun. 2006.

"Substrate Integrated Waveguide"; Microwave 101.com; retreived from http://microwaves101.com/encyclopedia/siw.cfm on Mar. 4, 2013; p. 1-5; May 3, 2012.

Pan, Bo, et al.; "A 60-GHz CPW-Fed High-Gain and Broadband Integrated Horn Antenna"; IEEE Transactions on Antennas and Propagation; vol. 57, No. 4; p. 1050-1056; Apr. 2009.

Alex Panther, "Low Temperature Cofired Ceramics for LMCS/LMDS Applications", Carleton University, 2001, pp. 1-205.

Edward R. Pillai, "Coax Via-A Technique to Reduce Crosstalk and Enhance Impedance Match at Vias in High-Frequency Multilayer Packages Verified by FDTD and MoM Modeling" IEEE Transactions on Microwave Theory and Techniques, vol. 45, No. 10, Oct. 1997, pp. 1981-1985.

George E. Ponchak, et al., "Coupling Between Microstrip Lines With Finite Width Ground Plane Embedded in Thin Film Circuits", IEEE Transactions on Advanced Packaging, vol. 28, Issue 2, 16 pages; May 2005.

The Portable Mulitmedia Blog; "World's first Notebook PCT with Integrated 60GHz WirelessHD"; retrieved from http://portablemultimedia.blogspot.ca/2010/06/worlds-first-notebook-pc-with.html on Mar. 21, 2013; p. 1-6; Jun. 1, 2010.

Jean-Pierre Raskin, Gildas Gauthier, Linda P. Katehi, and Gabriel M. Rebeiz, "W-Band Single-Layer Vertical Transitions" IEEE Transactions on Microwave Theory and Techniques, vol. 48, No. 1, Jan. 2000, pp. 161-164.

Razavi, Seyed Ali, et al.; "Low Profile H-Plane Horn Antenna Based on Half Mode Substrate Integrated Waveguide Technique"; 20th Iranian Conference on Electrical Engineering, (ICEE2012); p. 1351-1354; May 15-17, 2012.

Iulian Rosu, "Microstrip, Stripline, and CPW Design", downloaded from http://www.qsl.net/va3iul/Microstrip_Stripline_CPW_Design/Microstrip_Stripline_and_CPW_Design.pdf on Sep. 17, 2013, pp. 1-26.

Suga, Ryosuke, et al.; "Lateral Radiation Millimeter-Wave Antenna Package Using Post-Wall Waveguide"; Antennas and Propogation Society International Symposium 2009, APSURSI ;09, IEEE; p. 1-4; Jun. 1-5, 2009.

Schmückle, F. J., Pursche, U. ; Heinrich, W. ; Purden, J. "A 77 GHz Broadband Flip-Chip Transition on LTCC Submount", Microwave Symposium Digest (MTT), 2010 IEEE MTT-S International, pp. 453-456.

Sheen, Jyh-Wen, "Wide Band Tapered Microstrip Leaky-Wave Antenna", 30th European Microwave Conference, Oct. 2000, ieeexplore.ieee.org/xpl/login.jsp?tp=&arnumber=4139826 &url=http%3A%2F%2Fie accessed Sep. 17, 2013, 1 pg.

Suga, Ryosuke, et al.; "Cost-Effective 60-GHz Antenna-Package with End-Fire Radiation from Open-Ended Post-Wall Waveguide for Wireless File-Transfer System"; Microwave Symposium Digest; p. 449-452; May 23-28, 2009.

Smith, Tony; "Qualcomm Chip Puts 60GHz Wireless Gigabit into Dell Ultrabook"; "WiGig delivered through Wi-Fi Kit"; retrieved from http://www.theregister.co.uk/2012/11/01/qualcomm_chip_puts_wigig_into_dell_ultrabook . . . on Mar. 21, 2013; 1 page; Nov. 1, 2013.

"The Wireless Gigabit Alliance"; Wikipedia; retrieved from http://en.wikipedia.org/wiki/Wireless_Gigabit_Alliance on Mar. 21, 2013; p. 1-5.

M. Wojnowski, et al., "A 77 GHz SiGe Mixer in an Embedded Wafer Level BGA Package", 2008 Electronic Components and Technology Conference, IEEE, p. 290-296.

M. Wojnowski, R. Lachner, J. Böck, C. Wagner, F. Starzer, G. Sommer, K. Pressel, R. Weigel , "Embedded Wafer Level Ball Grid Array (eWLB) Technology for Millimeter-Wave Applications", 2011 IEEE 13th Electronics Packaging Technology Conference, pp. 423-429.

Wei-Cheng Wu, et al., "60 GHz Broadband Micro-strip-to-CPW-Hot-Via Flip Chip Interconnects" Microwave and Wireless Components Letters, vol. 17, Issue 11, IEEE, 10 pages; Nov. 2007.

Xu, Feng, et al.; "Guided-Wave and Leakage Characteristics of Substrate Integrated Waveguide"; IEEE Transactions on Microwave Theory and Techniques; vol. 53, No. 1; p. 66-73; Jan. 2005.

Gu, Huanhuan, et al.; U.S. Appl. No. 13/871,054, filed Apr. 26, 2013; Title: Substrate Integrated Waveguide Horn Antenna.

(56) References Cited

OTHER PUBLICATIONS

Ghassemi, Nasser, et al.; U.S. Appl. No. 14/048,742, filed Oct. 8, 2013; Title: Millimeter-Wave Broadband Transition of Microstrip Line on Thin to Thick Substrates; 36 pages.

Office Action dated Mar. 26, 2015; U.S. Appl. No. 14/048,742, filed Oct. 8, 2013; 6 pages.

European Extended Search Report; Application No. 14188192.0; Feb. 26, 2015; 8 pages.

European Extended Search Report; Application No. 14187751.4; Feb. 26, 2015; 6 pages.

* cited by examiner

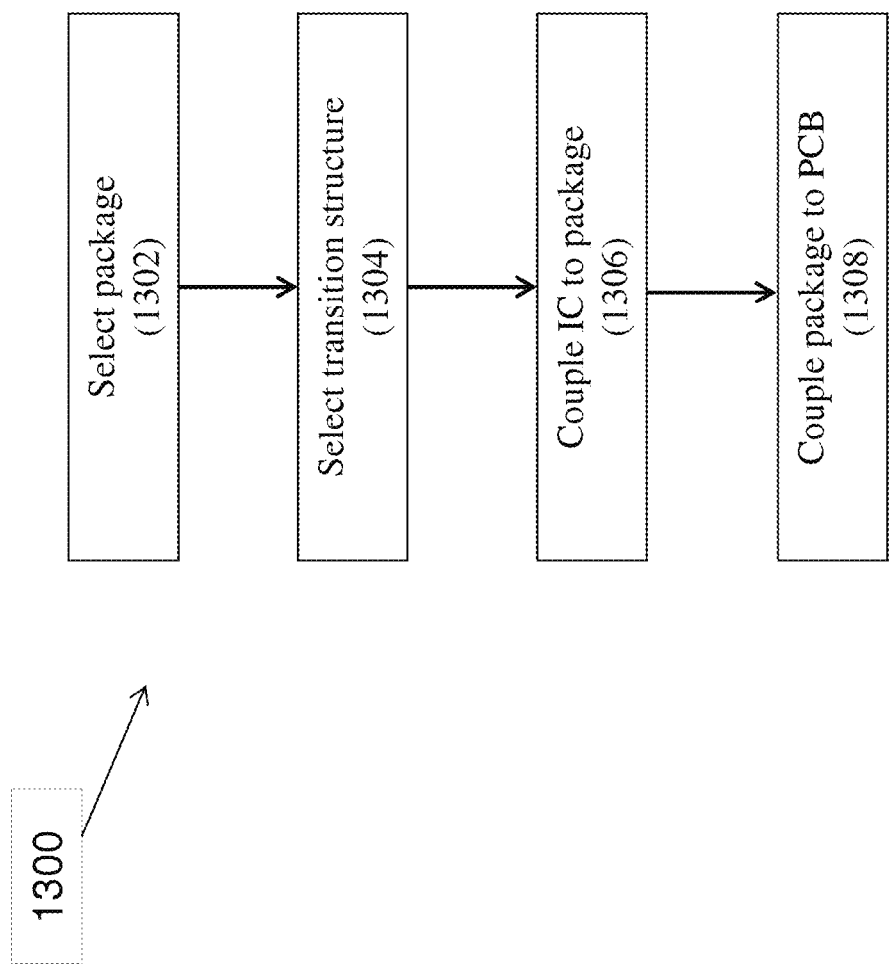

60 GHZ INTEGRATED CIRCUIT TO PRINTED CIRCUIT BOARD TRANSITIONS

BACKGROUND

Recently, spectrum around 60 GHz has attracted, e.g., industrial companies and research to explore its potential in wireless communications, short-distance data transfer, and other applications. Phased arrays of antennas may be used to increase antenna gain. A separate phase control may be used to steer the pattern of the antenna to obtain maximum gain.

With the use of planar printed circuit board (PCB) technology, or any other planar, multi-layer substrate technology, antennas are limited in their ability to steer the pattern of the antenna in certain dimensions or in certain directions. For example, using an end-fire array, the emerging radiation pattern will be substantially parallel to the plane of the PCB (e.g., the emerging radiation pattern will "fire off the edge" of the PCB).

One issue encountered with an end-fire antenna is that it cannot easily be integrated into a chip package. To overcome this, a radio frequency (RF) signal (e.g., 60 GHz) must be fed off the chip package and onto the PCB. The dimensions of PCB metallization and vias and typical ball grid array (BGA) pads are larger in many cases than signal transmission lines will allow.

BRIEF DESCRIPTION OF THE DRAWINGS

The present disclosure may be understood, and its numerous objects, features and advantages obtained, when the following detailed description is considered in conjunction with the following drawings, in which:

FIG. 13 illustrates a flow chart of a method in accordance with one or more embodiments.

DETAILED DESCRIPTION

Figure 1:
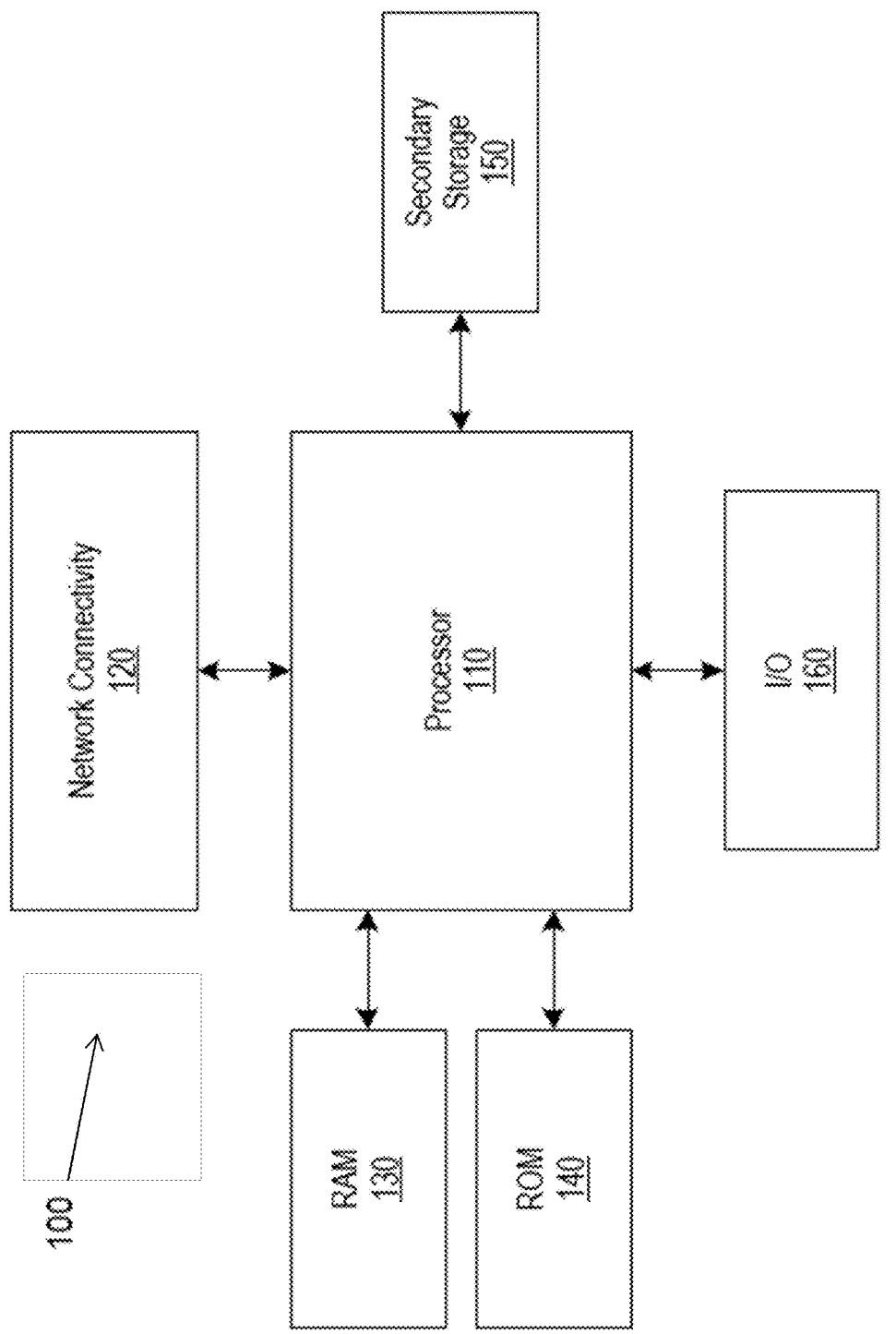
FIG. 1 depicts a system in which the present disclosure may be implemented.

The present disclosure is directed in general to communications systems and methods for operating the same. More specifically, aspects of the disclosure are directed to transitions between integrated circuits (ICs) and printed circuit boards (PCBs).

Embodiments are directed to a transition structure for interfacing an integrated circuit chip and a substrate, comprising: a vertical transmission section configured to bridge two layers of a package between two ground planes, a transmission line formed between the ground planes and connected to a center of the vertical transmission section, a second vertical transmission section coupled to the transmission line and a layer of the package, a plurality of solder connections coupled to the layer of the package, and a microstrip coupled to at least one of the solder connections.

Embodiments are directed to a transition structure for interfacing an integrated circuit chip and a substrate, comprising: a co-planar waveguide (CPW) structure formed based on ground-signal-ground (GSG) pads on the integrated circuit chip, a grounded co-planar waveguide (CPWG) structure coupled to the GSG pads, and a microstrip coupled to the CPWG structure.

Embodiments are directed to a transition structure for interfacing an integrated circuit chip and a substrate, comprising: a microstrip coupled to a grounded co-planar waveguide (CPWG) structure, a co-planar waveguide (CPW) structure coupled to the CPWG structure, wherein the CPWG structure transitions to the CPW structure based on a taper in a signal line and a triangular notch in a ground plane, and balls of a package coupled to the CPW structure.

Various illustrative embodiments of the present disclosure will now be described in detail with reference to the accompanying figures. While various details are set forth in the following description, it will be appreciated that the present disclosure may be practiced without these specific details, and that numerous implementation-specific decisions may be made to the disclosure described herein to achieve specific goals, such as compliance with process technology or design-related constraints, which will vary from one implementation to another. While such a development effort might be complex and time-consuming, it would nevertheless be a routine undertaking for those of skill in the art having the benefit of this disclosure. For example, selected aspects are shown in block diagram and flowchart form, rather than in detail, in order to avoid limiting or obscuring the present disclosure. In addition, some portions of the detailed descriptions provided herein are presented in terms of algorithms or operations on data within a computer memory. Such descriptions and representations are used by those skilled in the art to describe and convey the substance of their work to others skilled in the art.

As used herein, the terms "component," "system" and the like are intended to refer to a computer-related entity, either hardware, software, a combination of hardware and software, or software in execution. For example, a component may be, but is not limited to being, a processor, a process running on a processor, an object, an executable instruction sequence, a thread of execution, a program, or a computer. In an example, a component may be, but is not limited to being, circuitry, a process running on circuitry, an object, an executable instruction sequence, a thread of execution, a program, or a computing device. By way of illustration, both an application running on a computer and the computer itself can be a component. One or more components may reside within a process or thread of execution and a component may be localized on one computer or distributed between two or more computers.

As likewise used herein, the term "node" broadly refers to a connection point, such as a redistribution point or a communication endpoint, of a communication environment, such as a network. Accordingly, such nodes refer to an active electronic device capable of sending, receiving, or forwarding information over a communications channel. Examples of such nodes include data circuit-terminating equipment (DCE), such as a modem, hub, bridge or switch, and data terminal equipment (DTE), such as a handset, a printer or a host computer (e.g., a router, workstation or server). Examples of local area network (LAN) or wide area network (WAN) nodes include computers, packet switches, cable modems, Data Subscriber Line (DSL) modems, and wireless LAN (WLAN) access points. Examples of Internet or Intranet nodes include host computers identified by an Internet Protocol (IP) address, bridges and WLAN access points. Likewise, examples of nodes in cellular communication include base stations, relays, base station controllers, radio network controllers, home location registers (HLR), visited location registers (VLR), Gateway GPRS Support Nodes (GGSN), Serving GPRS Support Nodes (SGSN), Serving Gateways (S-GW), and Packet Data Network Gateways (PDN-GW).

Other examples of nodes include client nodes, server nodes, peer nodes and access nodes. As used herein, a client node may refer to wireless devices such as mobile telephones, smart phones, personal digital assistants (PDAs), handheld devices, portable computers, tablet computers, and similar devices or other user equipment (UE) that has telecommunications capabilities. Such client nodes may likewise refer to a mobile, wireless device, or alternatively, to devices that have similar capabilities that are not generally transportable, such as desktop computers, set-top boxes, or sensors. A network node, as used herein, generally includes all nodes with the exception of client nodes, server nodes and access nodes. Likewise, a server node, as used herein, refers to an information processing device (e.g., a host computer), or series of information processing devices, that perform information processing requests submitted by other nodes. As likewise used herein, a peer node may sometimes serve as client node, and at other times, a server node. In a peer-to-peer or overlay network, a node that actively routes data for other networked devices as well as itself may be referred to as a supernode.

An access node, as used herein, refers to a node that provides a client node access to a communication environment. Examples of access nodes include cellular network base stations and wireless broadband (e.g., WiFi, WiMAX, etc.) access points, which provide corresponding cell and WLAN coverage areas. As used herein, a macrocell is used to generally describe a traditional cellular network cell coverage area. Such macrocells are typically found in rural areas, along highways, or in less populated areas. As likewise used herein, a microcell refers to a cellular network cell with a smaller coverage area than that of a macrocell. Such micro cells are typically used in a densely populated urban area. Likewise, as used herein, a picocell refers to a cellular network coverage area that is less than that of a microcell. An example of the coverage area of a picocell may be a large office, a shopping mall, or a train station. A femtocell, as used herein, currently refers to the smallest commonly accepted area of cellular network coverage. As an example, the coverage area of a femtocell is sufficient for homes or small offices.

In general, a coverage area of less than two kilometers typically corresponds to a microcell, 200 meters or less for a picocell, and on the order of 10 meters for a femtocell. The actual dimensions of the cell may depend on the radio frequency of operation, the radio propagation conditions and the density of communications traffic. As likewise used herein, a client node communicating with an access node associated with a macrocell is referred to as a "macrocell client." Likewise, a client node communicating with an access node associated with a microcell, picocell, or femtocell is respectively referred to as a "microcell client," "picocell client," or "femtocell client."

The term "article of manufacture" (or alternatively, "computer program product") as used herein is intended to encompass a computer program accessible from any computer-readable device or media, e.g., machine readable media. For example, computer readable media can include but are not limited to magnetic storage devices (e.g., hard disk, floppy disk, magnetic strips, etc.), optical disks such as a compact disk (CD) or digital versatile disk (DVD), smart cards, and flash memory devices (e.g., card, stick, etc.). In an example, the machine readable media is in a tangible form capable of being detected by a machine, data being generated therefrom and such data being manipulated and transformed by a machine.

The word "exemplary" is used herein to mean serving as an example, instance, or illustration. Any aspect or design described herein as "exemplary" is not necessarily to be construed as preferred or advantageous over other aspects or designs. Those of skill in the art will recognize many modifications may be made to this configuration without departing from the scope, spirit or intent of the claimed subject matter. Furthermore, the disclosed subject matter may be implemented as a system, method, apparatus, or article of manufacture using standard programming and engineering techniques to produce software, firmware, hardware, or any combination thereof to control a computer or processor-based device to implement aspects detailed herein.

FIG. 1 illustrates an example of a system 100 suitable for implementing one or more embodiments disclosed herein. In various embodiments, the system 100 comprises a processor 110, which may be referred to as a central processor unit (CPU) or digital signal processor (DSP), network connectivity interfaces 120, random access memory (RAM) 130, read only memory (ROM) 140, secondary storage 150, and input/output (I/O) devices 160. In some embodiments, some of these components may not be present or may be combined in various combinations with one another or with other components not shown. These components may be located in a single physical entity or in more than one physical entity. Any actions described herein as being taken by the processor 110 might be taken by the processor 110 alone or by the processor 110 in conjunction with one or more components shown or not shown in FIG. 1.

The processor 110 executes instructions, codes, computer programs, or scripts that it might access from the network connectivity interfaces 120, RAM 130, or ROM 140. While only one processor 110 is shown, multiple processors may be present. Thus, while instructions may be discussed as being executed by a processor 110, the instructions may be executed simultaneously, serially, or otherwise by one or multiple processors 110 implemented as one or more CPU chips.

In various embodiments, the network connectivity interfaces 120 may take the form of modems, modem banks, Ethernet devices, universal serial bus (USB) interface devices, serial interfaces, token ring devices, fiber distributed data interface (FDDI) devices, wireless local area network (WLAN) devices (including radio, optical or infra-red signals), radio transceiver devices such as code division multiple access (CDMA) devices, global system for mobile communications (GSM) radio transceiver devices, long term evolution (LTE) radio transceiver devices, worldwide interoperability for microwave access (WiMAX) devices, and/or other well-known interfaces for connecting to networks, including Personal Area Networks (PANs) such as Bluetooth. These network connectivity interfaces 120 may enable the processor 110 to communicate with the Internet or one or more telecommunications networks or other networks from which the processor 110 might receive information or to which the processor 110 might output information.

The network connectivity interfaces 120 may also be capable of transmitting or receiving data wirelessly in the form of electromagnetic waves, such as radio frequency signals or microwave frequency signals. Information transmitted or received by the network connectivity interfaces 120 may include data that has been processed by the processor 110 or instructions that are to be executed by processor 110. The data may be ordered according to different sequences as may be desirable for either processing or generating the data or transmitting or receiving the data.

In various embodiments, the RAM 130 may be used to store volatile data and instructions that are executed by the processor 110. The ROM 140 shown in FIG. 1 may likewise be used to store instructions and data that is read during execution of the instructions. The secondary storage 150 is typically comprised of one or more disk drives, solid state drives, or tape drives and may be used for non-volatile storage of data or as an overflow data storage device if RAM 130 is not large enough to hold all working data. Secondary storage 150 may likewise be used to store programs that are loaded into RAM 130 when such programs are selected for execution. The I/O devices 160 may include liquid crystal displays (LCDs), Light Emitting Diode (LED) displays, Organic Light Emitting Diode (OLED) displays, projectors, televisions, touch screen displays, keyboards, keypads, switches, dials, mice, track balls, track pads, voice recognizers, card readers, paper tape readers, printers, video monitors, or other well-known input/output devices.

Figure 2:
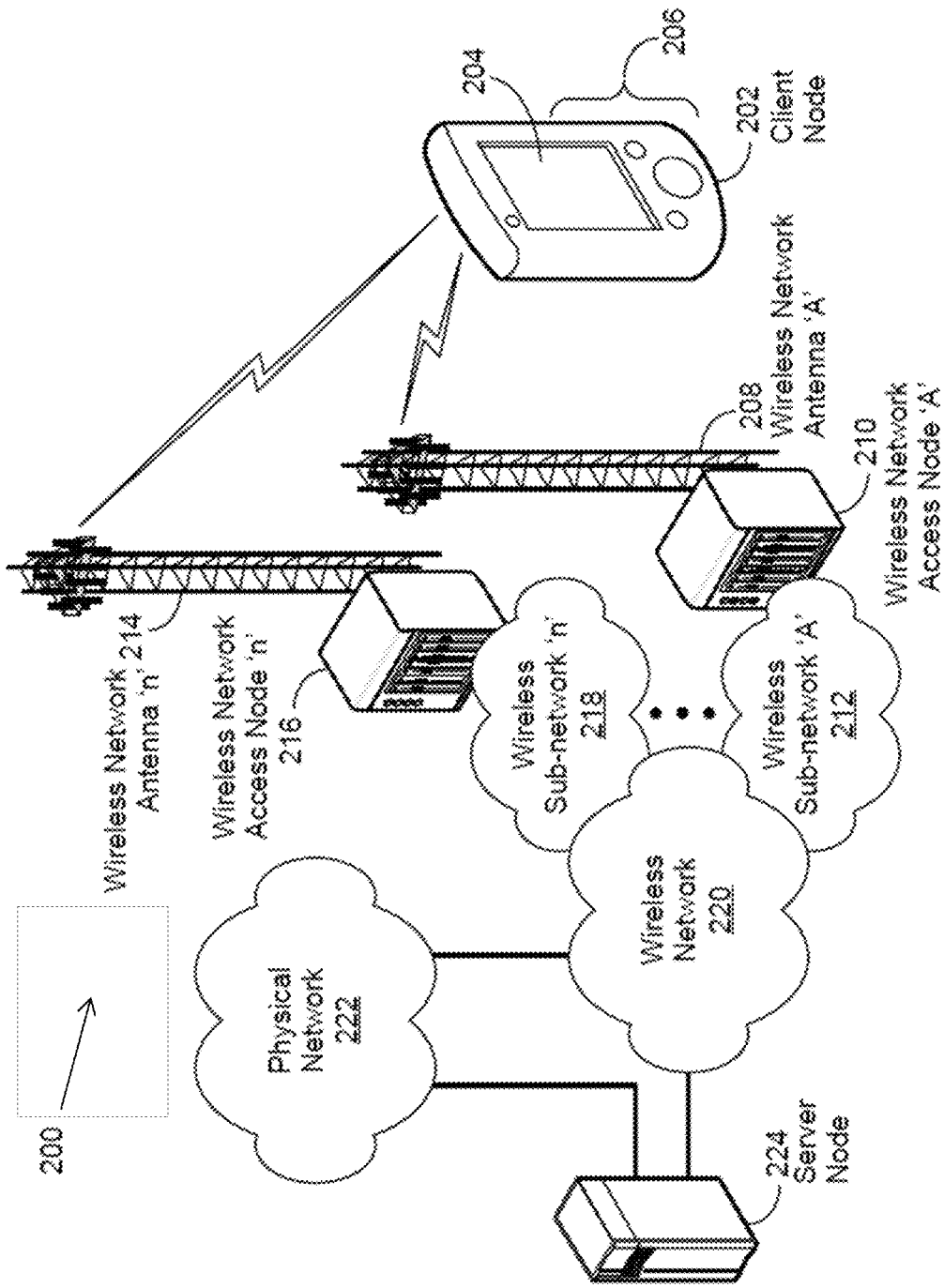
FIG. 2 shows a wireless-enabled communications environment including an embodiment of a client node.

FIG. 2 shows a wireless-enabled communications environment including an embodiment of a client node as implemented in an embodiment of the disclosure. Though illustrated as a mobile phone, the client node 202 may take various forms including a wireless handset, a pager, a smart phone, or a personal digital assistant (PDA). In various embodiments, the client node 202 may also comprise a portable computer, a tablet computer, a laptop computer, or any computing device operable to perform data communication operations. Many suitable devices combine some or all of these functions. In some embodiments, the client node 202 is not a general purpose computing device like a portable, laptop, or tablet computer, but rather is a special-purpose communications device such as a telecommunications device installed in a vehicle. The client node 202 may likewise be a device, include a device, or be included in a device that has similar capabilities but that is not transportable, such as a desktop computer, a set-top box, or a network node. In these and other embodiments, the client node 202 may support specialized activities such as gaming, inventory control, job control, task management functions, and so forth.

In various embodiments, the client node 202 includes a display 204. In these and other embodiments, the client node 202 may likewise include a touch-sensitive surface, a keyboard or other input keys 206 generally used for input by a user. The input keys 206 may likewise be a full or reduced alphanumeric keyboard such as QWERTY, DVORAK, AZERTY, and sequential keyboard types, or a traditional numeric keypad with alphabet letters associated with a telephone keypad. The input keys 206 may likewise include a trackwheel, an exit or escape key, a trackball, a track pad and other navigational or functional keys, which may be moved to different positions, e.g., inwardly depressed, to provide further input function. The client node 202 may likewise present options for the user to select, controls for the user to actuate, and cursors or other indicators for the user to direct.

The client node 202 may further accept data entry from the user, including numbers to dial or various parameter values for configuring the operation of the client node 202. The client node 202 may further execute one or more software or firmware applications in response to user commands. These applications may configure the client node 202 to perform various customized functions in response to user interaction. Additionally, the client node 202 may be programmed or configured over-the-air (OTA), for example from a wireless network access node 'A' 210 through 'n' 216 (e.g., a base station), a server node 224 (e.g., a host computer), or a peer client node 202.

Among the various applications executable by the client node 202 are a web browser, which enables the display 204 to display a web page. The web page may be obtained from a server node 224 through a wireless connection with a wireless network 220. As used herein, a wireless network 220 broadly refers to any network using at least one wireless connection between two of its nodes. The various applications may likewise be obtained from a peer client node 202 or other system over a connection to the wireless network 220 or any other wirelessly-enabled communication network or system.

In various embodiments, the wireless network 220 comprises a plurality of wireless sub-networks (e.g., cells with corresponding coverage areas) 'A' 212 through 'n' 218. As used herein, the wireless sub-networks 'A' 212 through 'n' 218 may variously comprise a mobile wireless access network or a fixed wireless access network. In these and other embodiments, the client node 202 transmits and receives communication signals, which are respectively communicated to and from the wireless network nodes 'A' 210 through 'n' 216 by wireless network antennas 'A' 208 through 'n' 214 (e.g., cell towers). In turn, the communication signals are used by the wireless network access nodes 'A' 210 through 'n' 216 to establish a wireless communication session with the client node 202. As used herein, the network access nodes 'A' 210 through 'n' 216 broadly refer to any access node of a wireless network. As shown in FIG. 2, the wireless network access nodes 'A' 210 through 'n' 216 are respectively coupled to wireless sub-networks 'A' 212 through 'n' 218, which are in turn connected to the wireless network 220.

In various embodiments, the wireless network 220 is coupled to a core network 222, e.g., a global computer network such as the Internet. Via the wireless network 220 and the core network 222, the client node 202 has access to information on various hosts, such as the server node 224. In these and other embodiments, the server node 224 may provide content that may be shown on the display 204 or used by the client node processor 110 for its operations. Alternatively, the client node 202 may access the wireless network 220 through a peer client node 202 acting as an intermediary, in a relay type or hop type of connection. As another alternative, the client node 202 may be tethered and obtain its data from a linked device that is connected to the wireless sub-network 212. Skilled practitioners of the art will recognize that many such embodiments are possible and the foregoing is not intended to limit the spirit, scope, or intention of the disclosure.

Figure 3:
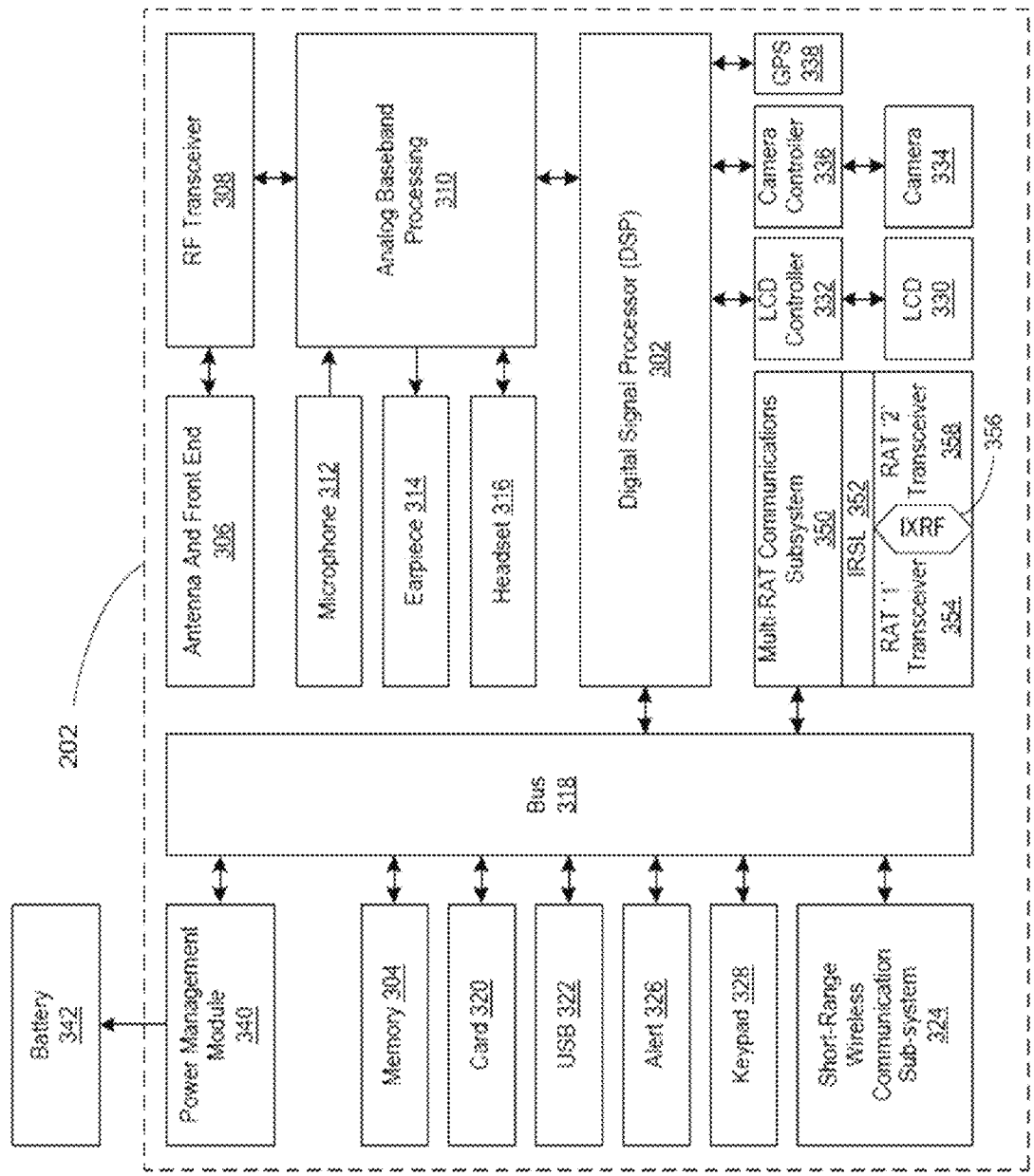
FIG. 3 is a simplified block diagram of a client node comprising a digital signal processor (DSP)

FIG. 3 depicts a block diagram of an exemplary client node as implemented with a digital signal processor (DSP) in accordance with an embodiment of the disclosure. While various components of a client node 202 are depicted, various embodiments of the client node 202 may include a subset of the listed components or additional components not listed. As shown in FIG. 3, the client node 202 includes a DSP 302 and a memory 304. As shown, the client node 202 may further include an antenna and front end unit 306, a radio frequency (RF) transceiver 308, an analog baseband processing unit 310, a microphone 312, an earpiece speaker 314, a headset port 316, a bus 318, such as a system bus or an input/output (I/O) interface bus, a removable memory card 320, a universal serial bus (USB) port 322, a short range wireless communication sub-system 324, an alert 326, a keypad 328, a liquid crystal display (LCD) 330, which may include a touch sensitive surface, an LCD controller 332, a charge-coupled device (CCD) camera 334, a camera controller 336, and a global positioning system (GPS) sensor 338, and a power management module 340 operably coupled to a power storage unit, such as a battery 342. In various embodiments, the client node 202 may include another kind of display that does not provide a touch sensitive screen. In one embodiment, the DSP 302 communicates directly with the memory 304 without passing through the input/output interface ("Bus") 318.

In various embodiments, the DSP 302 or some other form of controller or central processing unit (CPU) operates to control the various components of the client node 202 in accordance with embedded software or firmware stored in memory 304 or stored in memory contained within the DSP 302 itself. In addition to the embedded software or firmware, the DSP 302 may execute other applications stored in the memory 304 or made available via information media such as portable data storage media like the removable memory card 320 or via wired or wireless network communications. The application software may comprise a compiled set of machine-readable instructions that configure the DSP 302 to provide the desired functionality, or the application software may be high-level software instructions to be processed by an interpreter or compiler to indirectly configure the DSP 302.

The antenna and front end unit 306 may be provided to convert between wireless signals and electrical signals, enabling the client node 202 to send and receive information from a cellular network or some other available wireless communications network or from a peer client node 202. In an embodiment, the antenna and front end unit 106 may include multiple antennas to support beam forming and/or multiple input multiple output (MIMO) operations. As is known to those skilled in the art, MIMO operations may provide spatial diversity, which can be used to overcome difficult channel conditions or to increase channel throughput. Likewise, the antenna and front-end unit 306 may include circuitry, for example, antenna tuning or impedance matching components, RF power amplifiers, or low noise amplifiers.

In various embodiments, the RF transceiver 308 provides frequency shifting, converting received RF signals to baseband and converting baseband transmit signals to RF. In some descriptions a radio transceiver or RF transceiver may be understood to include other signal processing functionality such as modulation/demodulation, coding/decoding, interleaving/deinterleaving, spreading/despreading, inverse fast Fourier transforming (IFFT)/fast Fourier transforming (FFT), cyclic prefix appending/removal, and other signal processing functions. For the purposes of clarity, the description here separates the description of this signal processing from the RF and/or radio stage and conceptually allocates that signal processing to the analog baseband processing unit 310 or the DSP 302 or other central processing unit. In some embodiments, the RF Transceiver 108, portions of the Antenna and Front End 306, and the analog base band processing unit 310 may be combined in one or more processing units and/or application specific integrated circuits (ASICs).

Note that in this diagram the radio access technology (RAT) RAT1 and RAT2 transceivers 354, 358, the DCRF 356, the IRSL 352 and Multi-RAT subsystem 350 are operably coupled to the RF transceiver 308 and analog baseband processing unit 310 and then also coupled to the antenna and front end 306 via the RF transceiver 308. As there may be multiple RAT transceivers, there will typically be multiple antennas or front ends 306 or RF transceivers 308, one for each RAT or band of operation.

The analog baseband processing unit 310 may provide various analog processing of inputs and outputs for the RF transceivers 308 and the speech interfaces (312, 314, 316). For example, the analog baseband processing unit 310 receives inputs from the microphone 312 and the headset 316 and provides outputs to the earpiece 314 and the headset 316. To that end, the analog baseband processing unit 310 may have ports for connecting to the built-in microphone 312 and the earpiece speaker 314 that enable the client node 202 to be used as a cell phone. The analog baseband processing unit 310 may further include a port for connecting to a headset or other hands-free microphone and speaker configuration. The analog baseband processing unit 310 may provide digital-to-analog conversion in one signal direction and analog-to-digital conversion in the opposing signal direction. In various embodiments, at least some of the functionality of the analog baseband processing unit 310 may be provided by digital processing components, for example by the DSP 302 or by other central processing units.

The DSP 302 may perform modulation/demodulation, coding/decoding, interleaving/deinterleaving, spreading/despreading, inverse fast Fourier transforming (IFFT)/fast Fourier transforming (FFT), cyclic prefix appending/removal, and other signal processing functions associated with wireless communications. In an embodiment, for example in a code division multiple access (CDMA) technology application, for a transmitter function the DSP 302 may perform modulation, coding, interleaving, and spreading, and for a receiver function the DSP 302 may perform despreading, deinterleaving, decoding, and demodulation. In another embodiment, for example in an orthogonal frequency division multiplex access (OFDMA) technology application, for the transmitter function the DSP 302 may perform modulation, coding, interleaving, inverse fast Fourier transforming, and cyclic prefix appending, and for a receiver function the DSP 302 may perform cyclic prefix removal, fast Fourier transforming, deinterleaving, decoding, and demodulation. In other wireless technology applications, yet other signal processing functions and combinations of signal processing functions may be performed by the DSP 302.

The DSP 302 may communicate with a wireless network via the analog baseband processing unit 310. In some embodiments, the communication may provide global computer network (e.g., Internet) connectivity, enabling a user to gain access to content on the global computer network and to send and receive e-mail or text messages. The input/output interface 318 interconnects the DSP 302 and various memories and interfaces. The memory 304 and the removable memory card 320 may provide software and data to configure the operation of the DSP 302. Among the interfaces may be the USB interface 322 and the short range wireless communication sub-system 324. The USB interface 322 may be used to charge the client node 202 and may also enable the client node 202 to function as a peripheral device to exchange information with a personal computer or other computer system. The short range wireless communication sub-system 324 may include an infrared port, a Bluetooth interface, an IEEE 802.11 compliant wireless interface, or any other short range wireless communication sub-system, which may enable the client node 202 to communicate wirelessly with other nearby client nodes and access nodes. The short-range wireless communication Sub-system 324 may also include suitable RF Transceiver, Antenna and Front End subsystems.

The input/output interface ("Bus") 318 may further connect the DSP 302 to the alert 326 that, when triggered, causes the client node 202 to provide a notice to the user, for example, by ringing, playing a melody, or vibrating. The alert 326 may serve as a mechanism for alerting the user to any of various events such as an incoming call, a new text message, and an appointment reminder by silently vibrating, or by playing a specific pre-assigned melody for a particular caller.

The keypad 328 couples to the DSP 302 via the I/O interface ("Bus") 318 to provide one mechanism for the user to make selections, enter information, and otherwise provide input to the client node 202. The keyboard 328 may be a full or reduced alphanumeric keyboard such as QWERTY, DVORAK, AZERTY and sequential types, or a traditional numeric keypad with alphabet letters associated with a telephone keypad. The input keys may likewise include a trackwheel, track pad, an exit or escape key, a trackball, and other navigational or functional keys, which may be inwardly depressed to provide further input function. Another input mechanism may be the LCD 330, which may include touch screen capability and also display text and/or graphics to the user. The LCD controller 332 couples the DSP 302 to the LCD 330.

The CCD camera 334, if equipped, enables the client node 202 to make digital pictures. The DSP 302 communicates with the CCD camera 334 via the camera controller 336. In another embodiment, a camera operating according to a technology other than Charge Coupled Device cameras may be employed. The GPS sensor 338 is coupled to the DSP 302 to decode global positioning system signals or other navigational signals, thereby enabling the client node 202 to determine its position. The GPS sensor 338 may be coupled to an antenna and front end (not shown) suitable for its band of operation. Various other peripherals may also be included to provide additional functions, such as radio and television reception.

In various embodiments, the client node (e.g., 202) comprises a first Radio Access Technology (RAT) transceiver 354 and a second RAT transceiver 358. As shown in FIG. 3, and described in greater detail herein, the RAT transceivers '1' 354 and '2' 358 are in turn coupled to a multi-RAT communications subsystem 350 by an Inter-RAT Supervisory Layer Module 352. In turn, the multi-RAT communications subsystem 350 is operably coupled to the Bus 318. Optionally, the respective radio protocol layers of the first Radio Access Technology (RAT) transceiver 354 and the second RAT transceiver 358 are operably coupled to one another through an Inter-RAT eXchange Function (IRXF) Module 356.

In various embodiments, the network node (e.g. 224) acting as a server comprises a first communication link corresponding to data to/from the first RAT and a second communication link corresponding to data to/from the second RAT.

Embodiments of the disclosure may be associated with communication at radio frequency (RF). For example, aspects of the disclosure may be used in connection with millimeter wave (mmWave) radio. In some embodiments, a 60 GHz spectrum may include one or more channels, bands or ranges. For example, a first range may be from 57.2 GHz-59.4 GHz, a second range may be from 59.4 GHz to 61.5 GHz, a third range may be from 61.5 GHz to 63.7 GHz, and a fourth range may be from 63.7 GHz to 65.8 GHz.

As described above, embodiments of the disclosure may be used to facilitate a transition from an IC package to a PCB. One or more package configurations may be used, such as a low temperature co-fired ceramic (LTCC) package, a flip-chip package, and a wafer level fan-out (WLFO) package.

Figure 4:
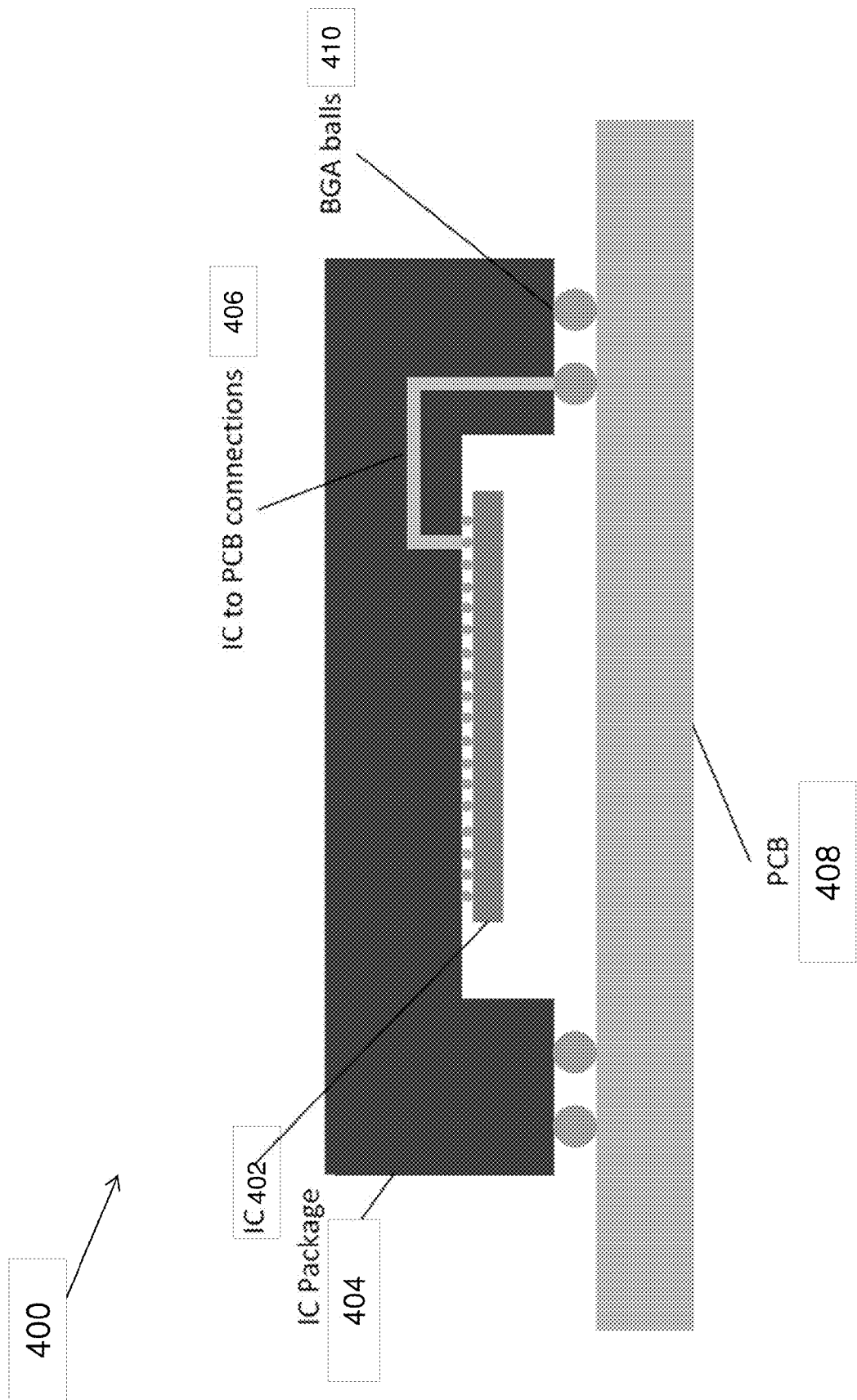
FIG. 4 illustrates a package configuration in accordance with one or more embodiments.

Referring to FIG. 4, a basic package configuration 400 in accordance with one or more embodiments is shown. The package configuration 400 may be used in connection with an LTCC package, or any package or package material with a similar orientation. Package configuration 400 can connect an array of mmWave antennas to other circuitry, e.g., on the PCB, in a mobile electronic device.

The package configuration 400 includes an IC 402 coupled to an IC package 404. The IC 402 may be inverted inside the package 404 relative to conventional mounting or coupling techniques. Included in the package 404 may be one or more connections 406 to facilitate connecting the IC 402 to a PCB 408. The connection may occur using a solder connection, e.g., ball grid array (BGA) solder balls 410.

Figure 5:
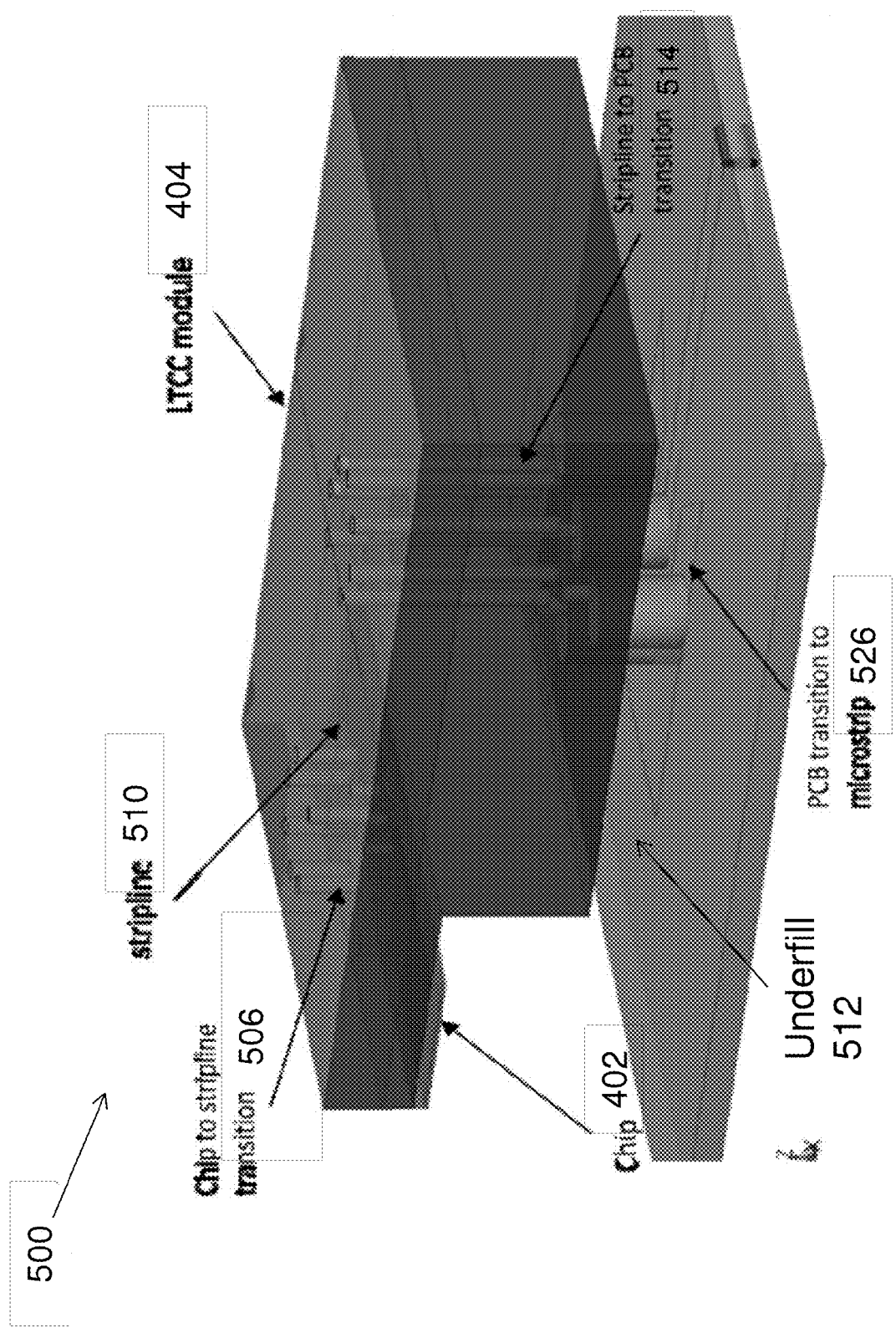
FIG. 5 illustrates a chip-to-stripline-to-PCB transition in accordance with one or more embodiments.
Figure 6:
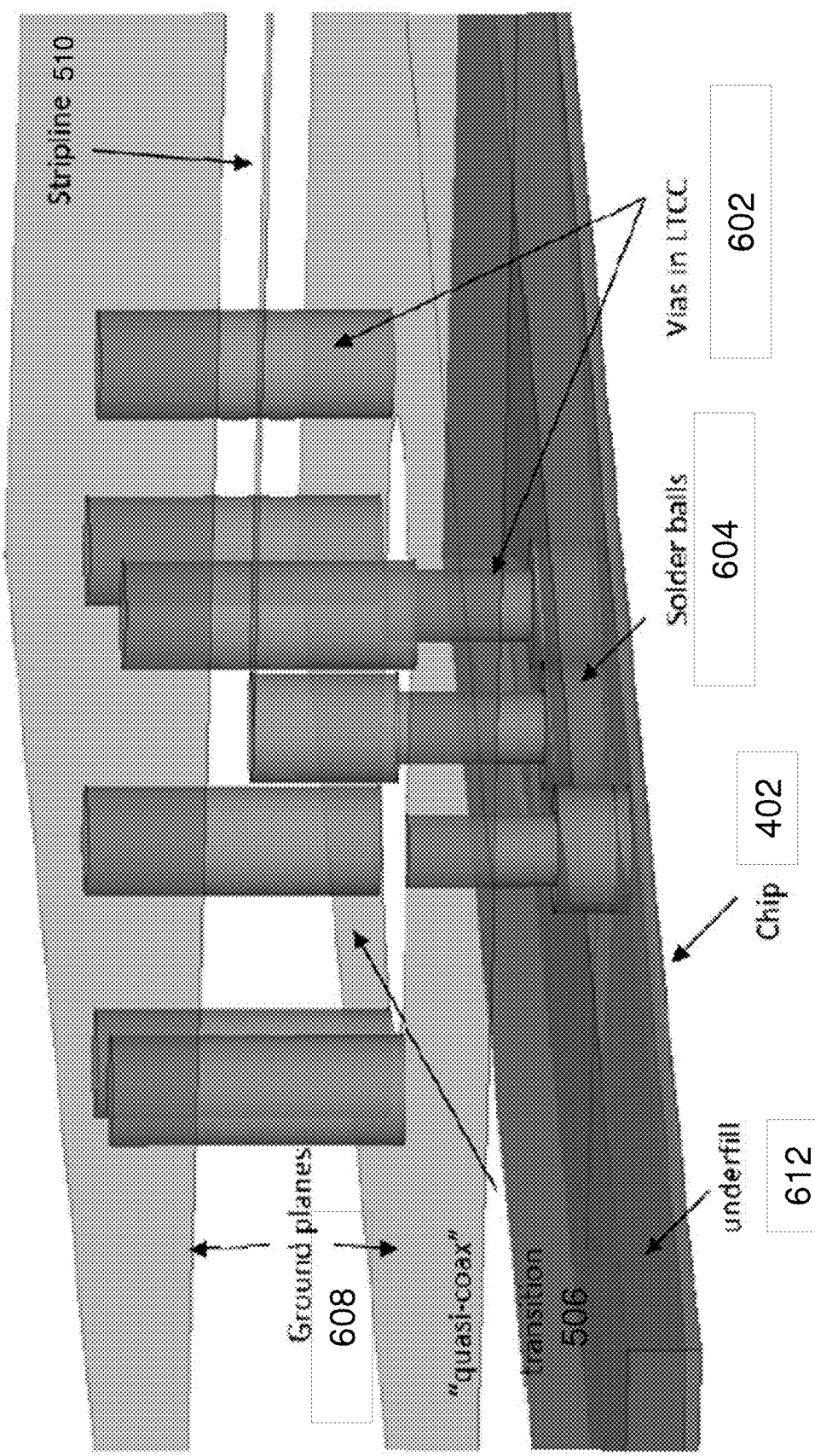
FIG. 6 illustrates a chip-side transition in accordance with one or more embodiments.

Referring now to FIG. 5, a transition structure 500 for facilitating the connection 406 from the IC 402 to the PCB 408 is shown. Ground-signal-ground (GSG) pads on the IC 402 may create a co-planar waveguide (CPW) structure. Referring to FIG. 6, this CPW structure may be continued above in a first layer of the package 404 with vias 602 going to the next or second layer. Connections between the IC 402 and the package 404 may be facilitated by one or more solder connections, e.g., solder balls 604. Underfill 612 may be used between the IC and the package as shown in FIG. 6. Similarly, underfill 512 may be used between the package and PCB as reflected in FIG. 5.

As described below, the structure 500 may make use of stripline. As used herein, stripline refers to a transverse electromagnetic (TEM) transmission line medium that uses a flat strip of conductor/metal sandwiched between parallel ground planes. The stripline may be supported by a dielectric.

Starting from the second layer above the IC 402, a chip to stripline transition or quasi-coax line/section 506, as would be known to one of skill in the art, may bridge two layers of the package 404 between two ground planes 608, where the ground planes 608 may be different ground planes. A stripline 510 may be formed between the ground planes 608 and may be connected to a center of the coax section 506.

In some embodiments the stripline 510 may carry signal in an area directly above where the IC 402 is mounted to the package 404 to an area on the perimeter of the package 404 where solder balls for the package (e.g., solder balls 410) may be placed.

Figure 7:
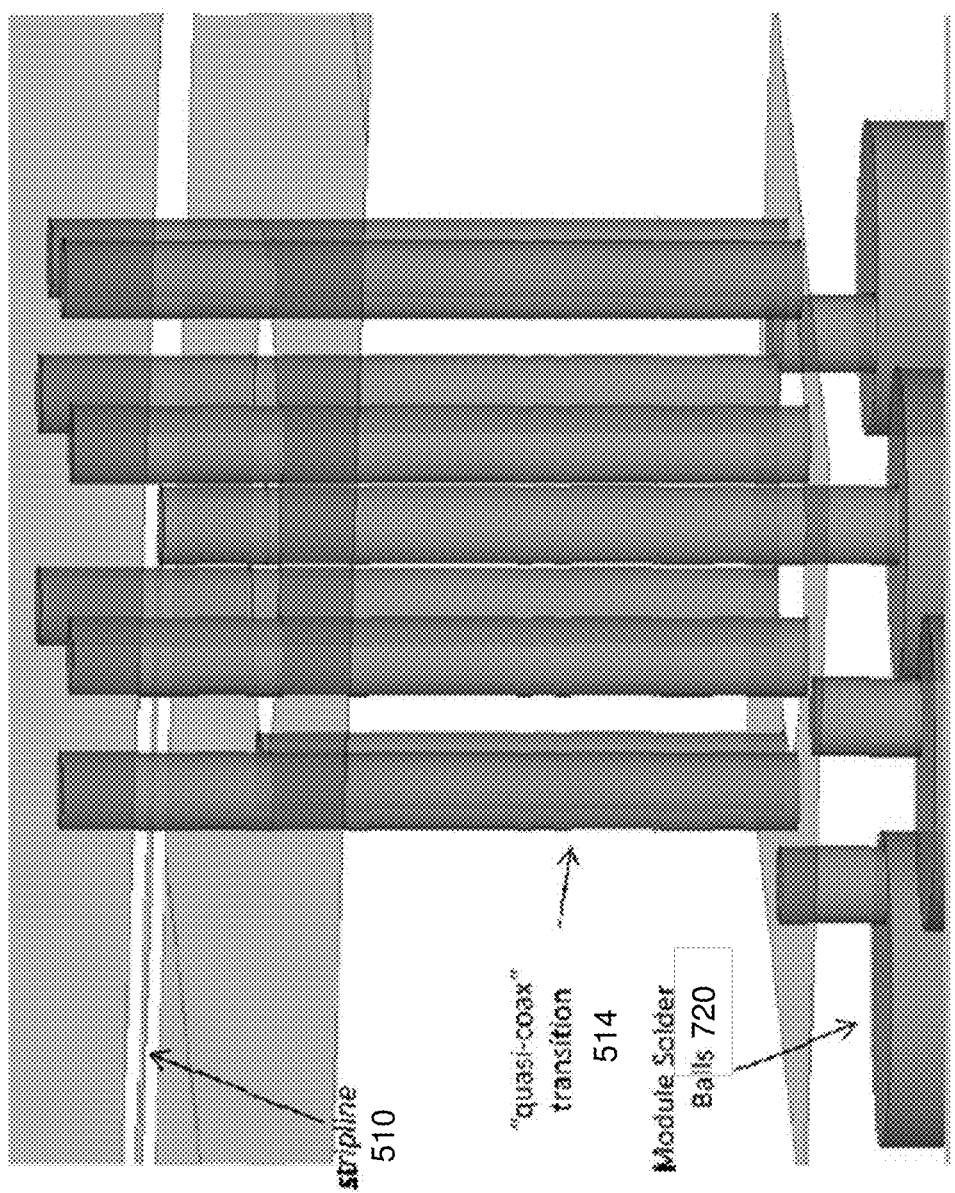
FIG. 7 illustrates a stripline-to-PCB transition in accordance with one or more embodiments.

Referring to FIGS. 5 and 7, the signal may be carried by the stripline 510 to a stripline-to-PCB or quasi-coax transition/section 514 (which may be similar to, or different from, the transition 506). The signal may be conveyed by the transition/section 514 through one or more layers of the package 404 to the bottom of the package 404.

Figure 8:
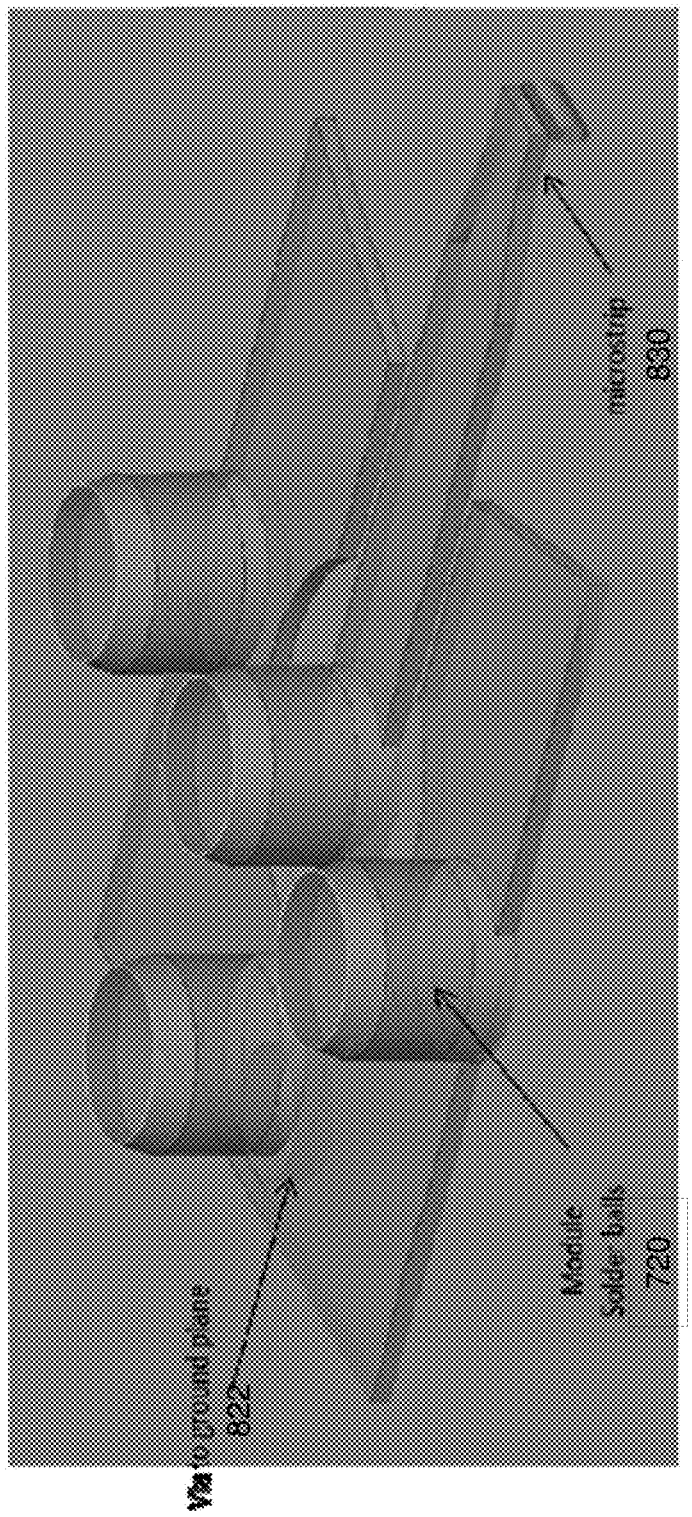
FIG. 8 illustrates a PCB-to-microstrip transition in accordance with one or more embodiments.

Referring to FIGS. 7 and 8, the final or bottom layer of the package 404 may translate the signal and ground into, e.g., four solder balls 720, which may match pads designed in the PCB 408. The solder balls 720 may correspond to the solder balls 410 of FIG. 4.

The arrangement shown in FIGS. 7 and 8 may be similar to the GSG arrangement described above in connection with the pads of the chip 402, but an additional, back ground signal may be included to reduce the radiation of the GSG balls from the package 404 to the PCB 408. In some instances, the solder balls 720 may have a pitch of 0.5 millimeters and the height of substrate may be enough that it may otherwise be difficult to avoid radiation between the package 404 and the PCB 408 without the inclusion of the additional ground signal.

The transition from the package 404 to the PCB 408 may take the three ground connections (e.g. solder balls) and one signal connection (e.g., ball) and transition to a ground coupled co-planar waveguide (CPWG). In such a design, a ground via 822 may be placed behind the transition in the PCB 408 to provide a direct current (DC) path to ground. The CPWG on the PCB 408 may then transition 526 through a taper to a microstrip line 830. In some embodiments, the ground via 822 might not be included. In some embodiments, there may be two ground balls on either side of a signal ball, and a back ground ball might not be used.

As an illustrative example, in some embodiments solder ball pitch (e.g., solder balls 410 or 720) may be 500 micrometers, a substrate height of the PCB 408 may be 50 micrometers, and as shown in FIG. 8 a 'T' pattern may be used in connection with the solder balls 720 with a signal solder ball in the middle surrounded by three ground solder balls. In yet another illustrative embodiment, the solder ball pitch may be 400 micrometers, the substrate height of the PCB may be 100 micrometers, and the transition may use a full BGA array (as opposed to the 'T' pattern).

Figure 9A:
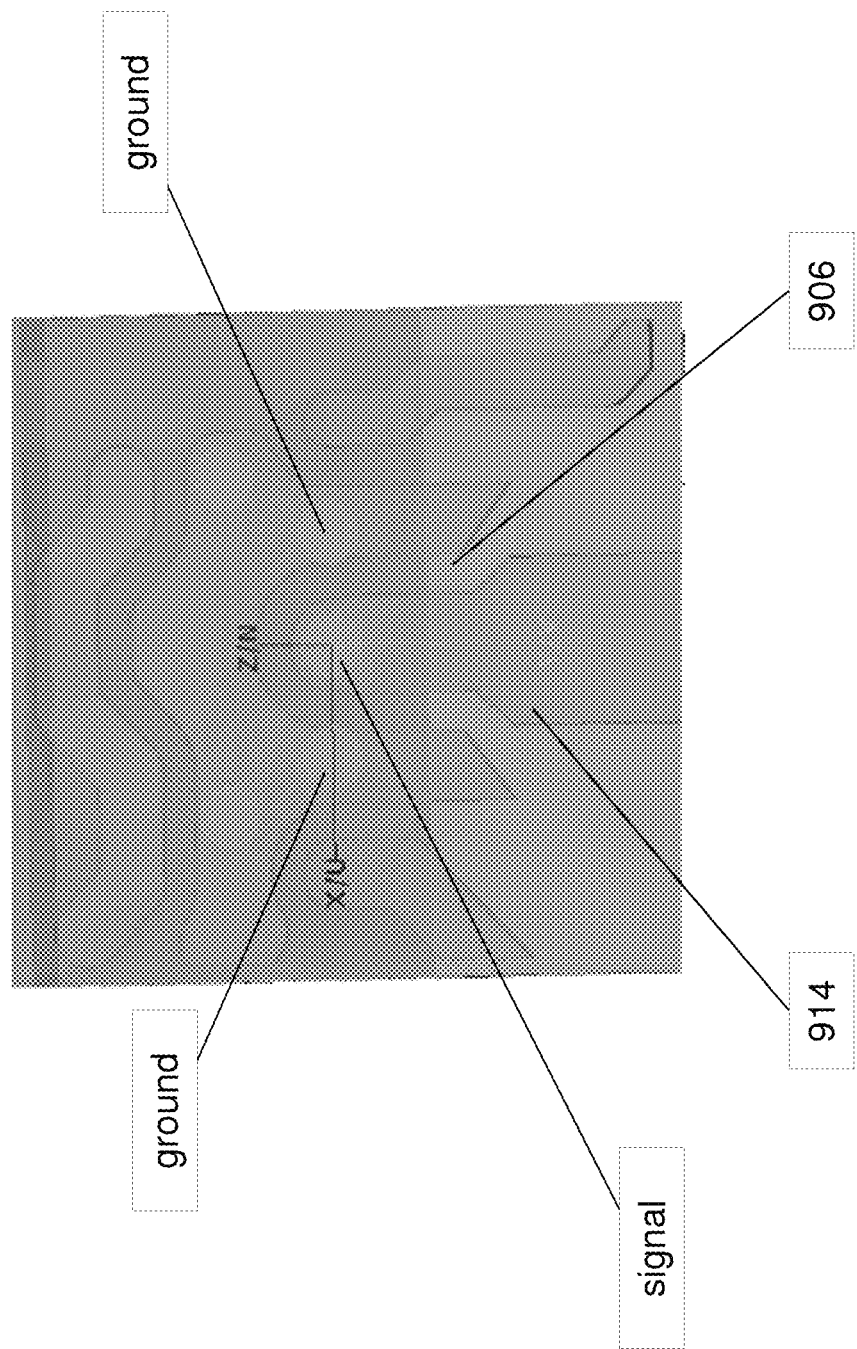
FIGS. 9A-9B illustrate a transition implemented in connection with a flip-chip in accordance with one or more embodiments.
Figure 9B:
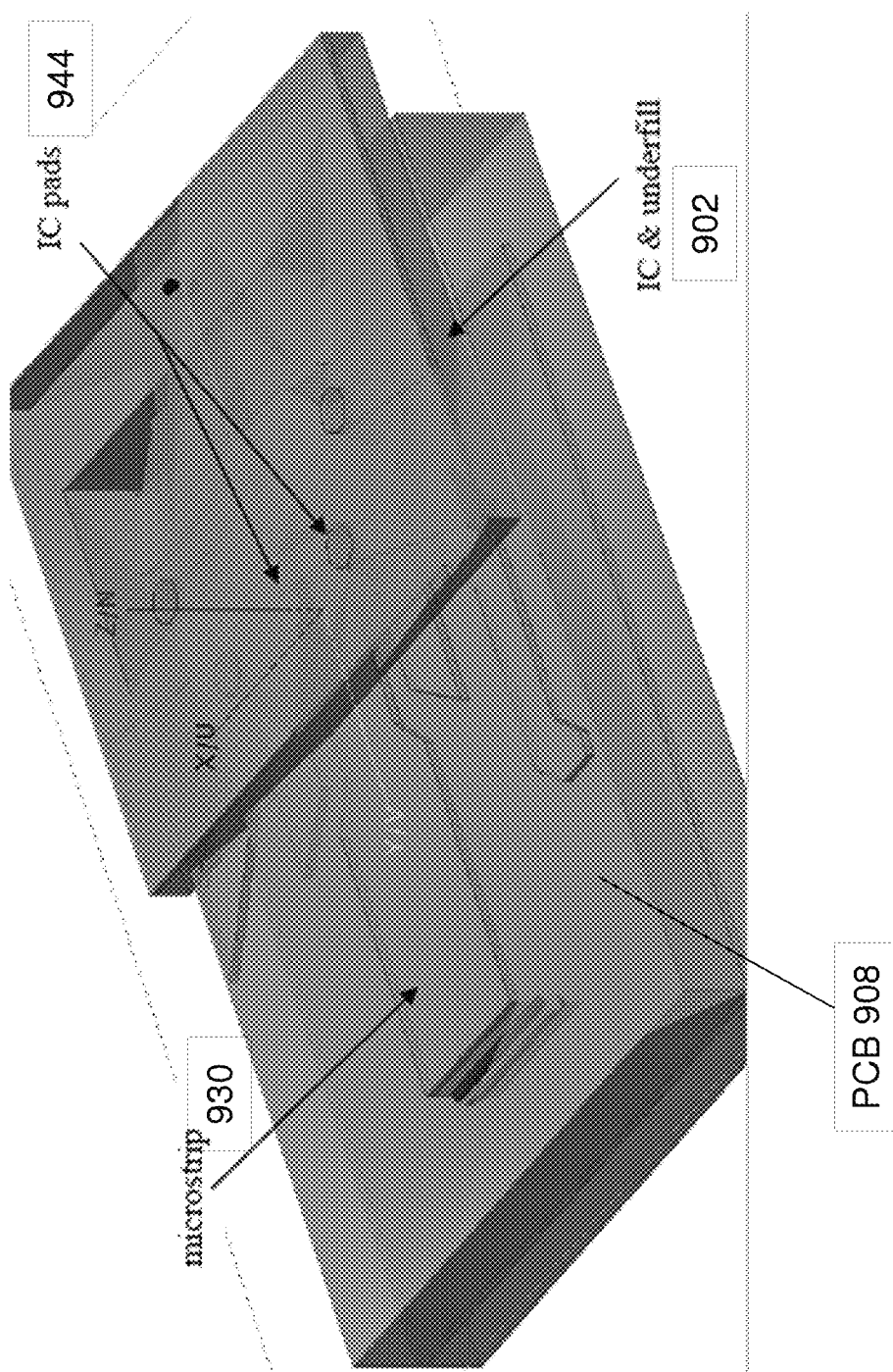

Referring to FIGS. 9A-9B (collectively referred to as FIG. 9), a transition implemented in connection with a flip-chip is shown. Specifically, FIG. 9A reflects a top view of the transition and FIG. 9B reflects a complete model of the transition.

As shown in FIG. 9, much like the embodiments described above in connection with LTCC and similar packaging, the flip-chip design may use pads 944 (e.g., GSG pads) on an IC 902 to create an effective CPW structure. This structure may be continued through balls on bare die.

The GSG balls/pads may connect to a CPWG structure 906 on PCB 908. The CPWG structure 906 may include one or more extra ground balls corresponding to ground points in the design of the IC 902. A ground ring may be designed to accommodate ground domains in connection with the IC 902 and the PCB 908, which may be motivated at least in part based on the pitch associated with the IC 902. The ground ring may be vialess.

A tapered transition 914 may be used between the CPWG structure 906 and a microstrip 930. The rest of the structures of FIG. 9 surrounding the CPWG section 906 are specific to the IC 902 and are included for simulating their coupling effect.

Flip-chip may represent an attractive package option due to a simplified number of layers for a mmWave transition. But, flip-chip may impose difficulty in connection with low-cost PCB fabrication. For example, a flip-chip may have a pad pitch on the order of, e.g., 160 micrometers, whereas standard BGA assembly capabilities for high volume production may require a pitch of at least 350 micrometers. In order to remedy such a situation, a chip-scale package (CSP) with redistribution layers called wafer level fan-out (WLFO) may be used in some embodiments. The WLFO package may provide for an increase in pitch without adding much complexity (e.g., layers) and cost to the IC.

Figure 10:
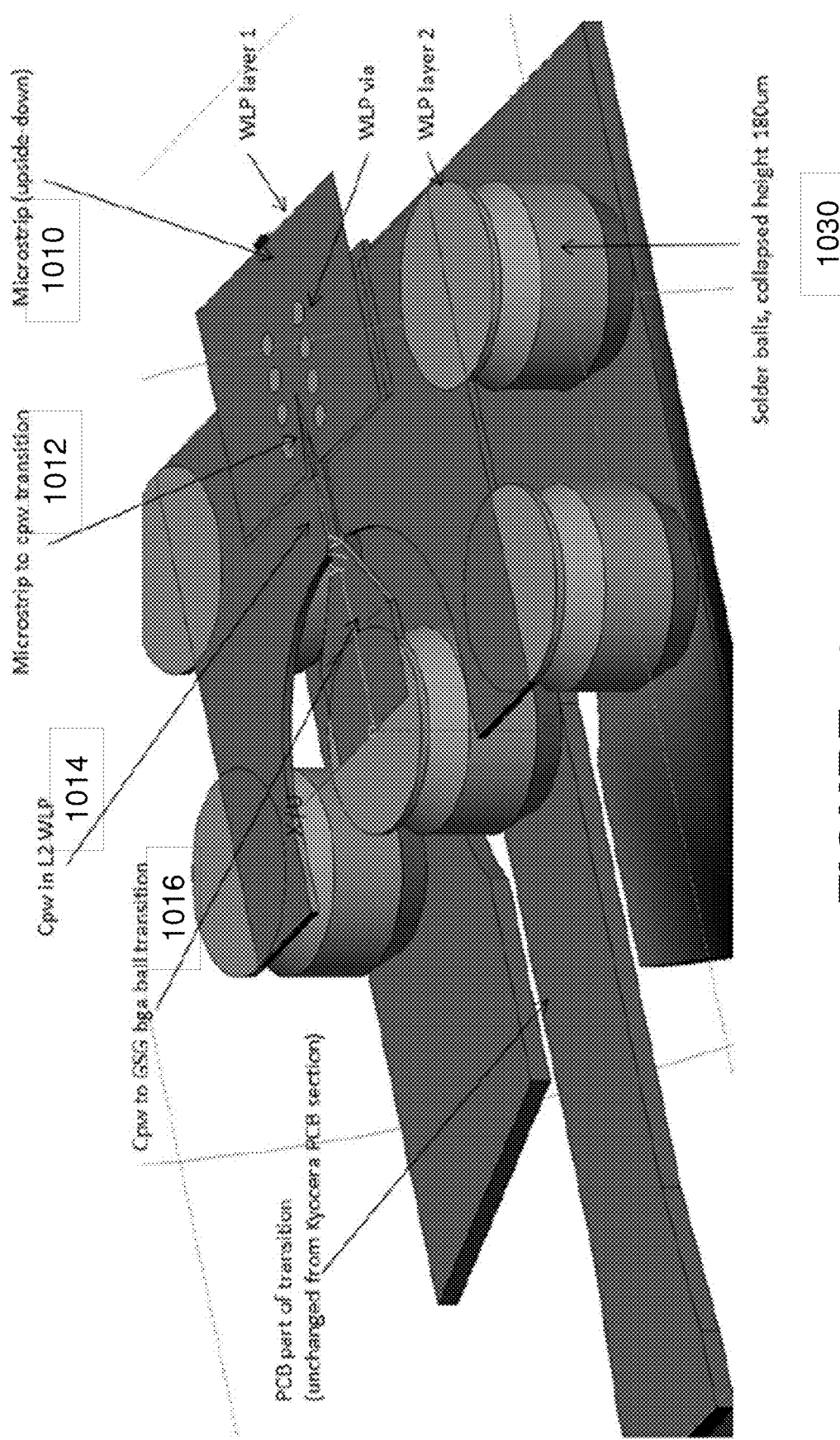
FIG. 10 illustrates a wafer level fan-out (WLFO) transition structure in accordance with one or more embodiments.
Figure 11:
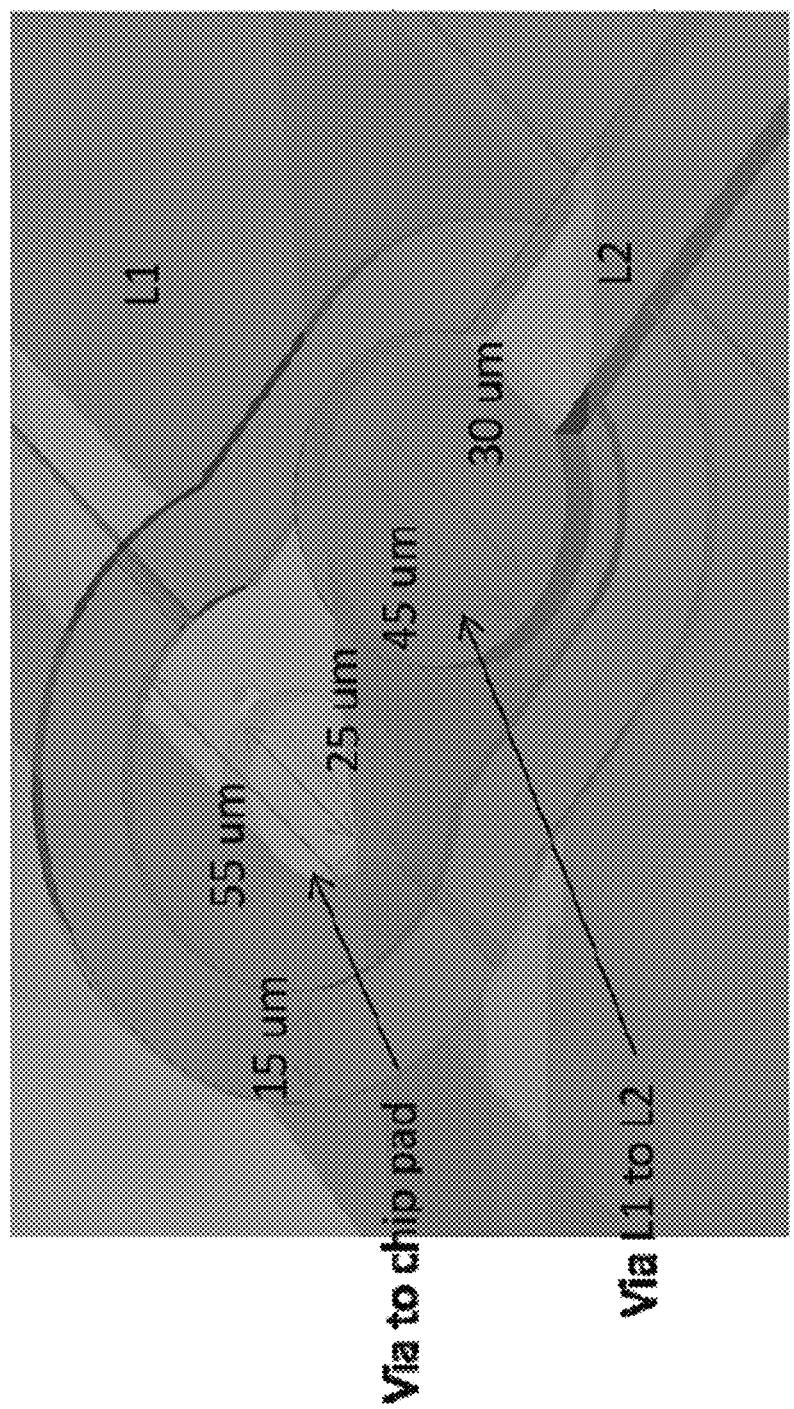
FIG. 11 illustrates a transition from ground-signal-ground (GSG) to microstrip in connection with the WLFO transition structure of FIG. 10.

Referring to FIG. 10, a transition implemented in connection with WLFO is shown. The WLFO transition may include GSG pads on the IC to create an (effective) CPW structure. Vias in the WLFO structure may connect this CPW structure to the chip-side of the transition (FIG. 11) where a small CPW structure transitions into a microstrip 1010. From the point of view of the finished PCB this microstrip 1010 may be upside-down. For example, the ground for the microstrip may be in the first WLFO layer (WLP layer 1 in FIG. 10, layer L1 in FIG. 11) and signal may be in the second layer (WLP layer 2 in FIG. 10, layer L2 in FIG. 11). The ground of the PCB may be much further away and might not appreciably impact the microstrip.

Figure 12A:
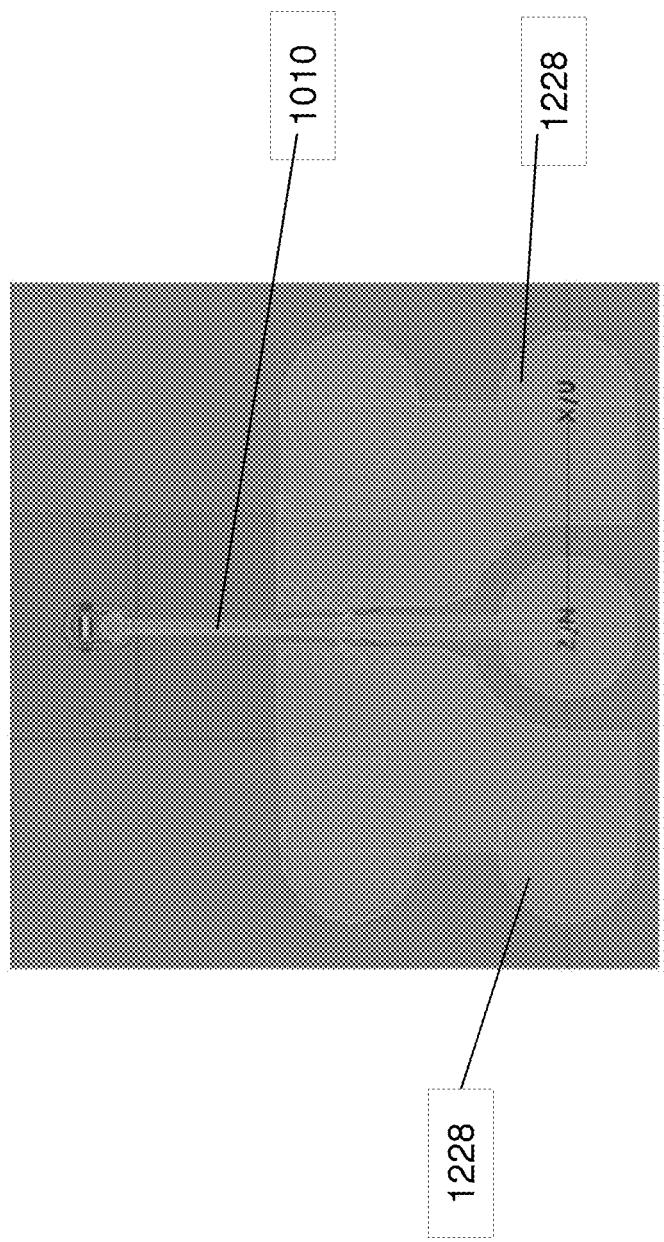
FIGS. 12A-12B illustrate the WLFO transition structure of FIG. 10.

Referring to FIGS. 10 and 12A, the microstrip 1010 may transition 1012 to a CPWG. A row of vias 1228 may be present on either side to connect the microstrip ground to the CPWG ground side.

Referring to FIG. 10, the CPWG may then transition to a pure CPW (e.g., a co-planar waveguide with no ground) 1014. This may be done with a taper in the signal line and a triangular notch in the ground plane.

The CPW may then transition to the balls (e.g., BGA balls) of the package 1016.

Figure 12B:
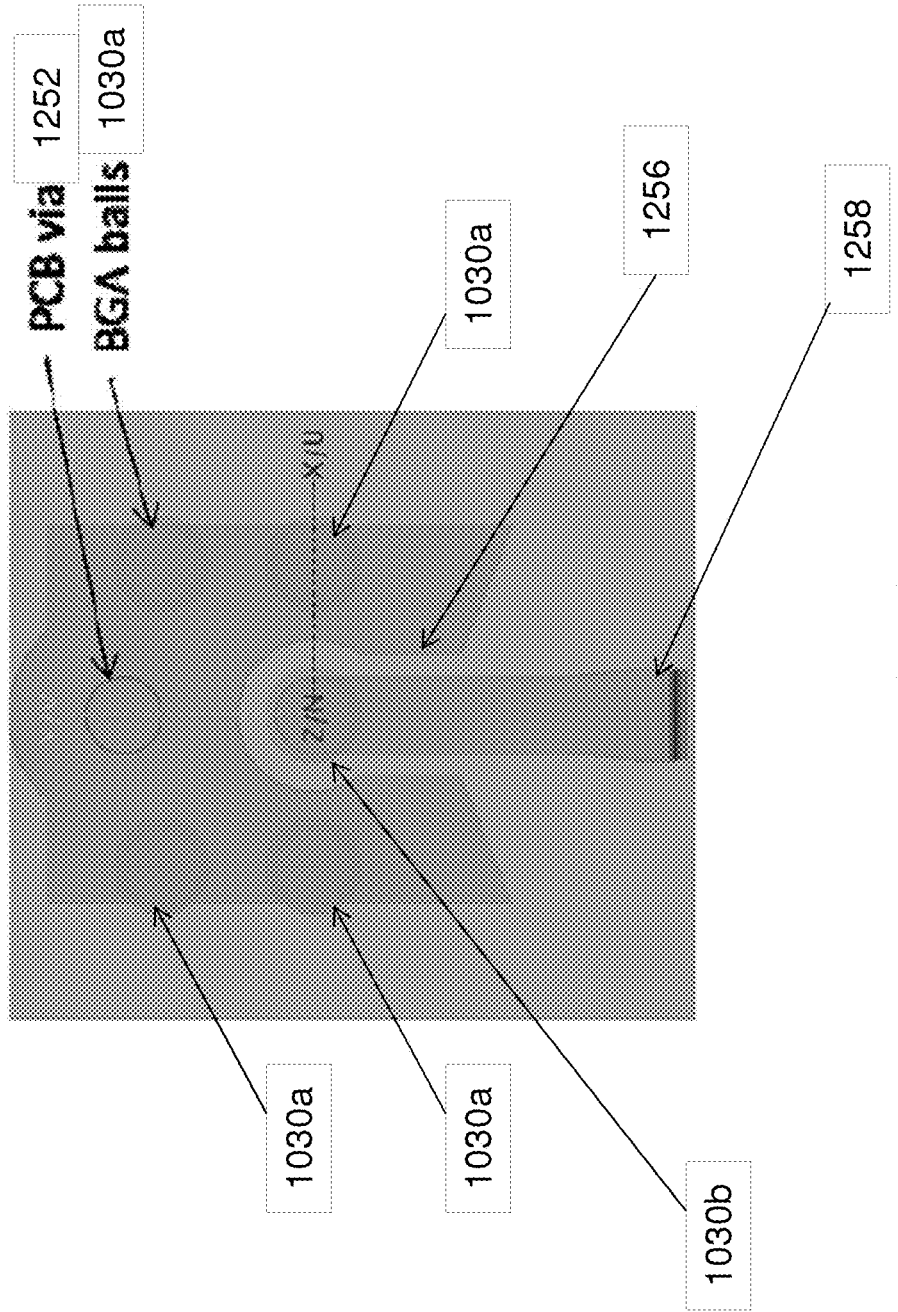

Whereas FIG. 12A depicts an exemplary view of the WLFO package from the bottom, FIG. 12B depicts an exemplary view of the PCB section from the top. As shown in FIG. 12B, a PCB via 1252 may be present to provide a direct current (DC) path to ground and one or more balls 1030 may facilitate coupling the WLFO package and the PCB. In some embodiments, the balls 1030 may have a "collapsed height" of 180 microns.

The transition from the package WLFO package in FIG. 12A to the PCB in FIG. 12B may take the four ground balls 1030a and one signal ball 1030b and transition to a ground coupled co-planar waveguide (CPWG) 1256. In such a design, a ground via 1252 may be placed behind the transition in the PCB to provide a direct current (DC) path to ground. The CPWG 1256 on the PCB may then transition through a taper to a microstrip line 1258.

Referring to FIG. 13, a flow chart of an exemplary method 1300 is shown. The method 1300 may execute in connection with one or more components, devices, or systems, such as those described herein. The method 1300 may be used to design and implement an interface transition between an IC and a PCB in connection with one or more package types. The design may facilitate use or operation at mmWave frequencies.

In block 1302, a package type or configuration for an IC may be selected. The selection of block 1302 may be based on one or more requirements. For example, cost of production, functionality needed, and other factors may be taken into consideration when selecting the package.

In block 1304, a transition structure may be selected. The selection of block 1304 may be based on the selection of block 1302. The selected transition structure may include one or more components, such as GSG pads, one or more quasi-coax structures, striplines, microstrip, CPW, CPWG, solder balls, etc.

In block 1306, the IC may be coupled to, or formed within, the package.

In block 1308, the package may be coupled to the PCB.

The method 1300 is illustrative. In some embodiments, one or more of the blocks or operations (or a portion thereof) may be optional. In some embodiments, additional blocks or operations may be included. In some embodiments, the blocks may execute in an order or sequence different from what is shown in FIG. 13.

The present description references ground, e.g., ground plane(s), ground connections, etc. It will be understood that ground can be Earth or zero potential. In other examples, ground is not necessarily Earth potential, and a "ground line" or "ground plane" need not be electrically connected to the Earth. Rather, ground basically connotes a node that is maintained at a reference voltage that is substantially constant with respect to other voltages in the structures and circuitry described herein.

Embodiments are directed to a transition structure for interfacing an integrated circuit chip (402) and a substrate (408), comprising: a vertical transmission section (506) configured to bridge two layers of a package (404) between two ground planes; a transmission line (510) formed between the ground planes and connected to a center of the vertical transmission section (506); a second vertical transmission section (514) coupled to the transmission line (510) and a layer of the package (404); a plurality of solder connections (720) coupled to the layer of the package (404); and a microstrip (830) coupled to at least one of the solder connections (720). The microstrip (830) may be coupled to the at least one of the solder connections (720) through a grounded co-planar waveguide structure (526). The transmission line (510) may comprise a stripline (510). At least one of the vertical transmission section (510) and the second vertical transmission section (514) may comprise a quasi-coax section (510, 514). The transmission line (510) may be configured to convey a millimeter wave signal associated with the integrated circuit (402). The at least one solder connection (720) may be associated with the signal, and the remainder of the solder connections (720) may be associated with a ground. The transition structure may comprise a via (822) configured to provide a direct current path to ground. The package (404) may be a low temperature co-fired ceramic package (404).

Embodiments are directed to a transition structure for interfacing an integrated circuit chip (902) and a substrate (908), comprising: a co-planar waveguide structure formed based on ground-signal-ground pads (944) on the integrated circuit chip (902); a grounded co-planar waveguide structure coupled to the ground-signal-ground pads (944); and a microstrip (930) coupled to the grounded co-planar waveguide structure. The transition structure may be associated with a flip-chip package. The transition structure may be configured to operate in accordance with a 60 GHz spectrum.

Embodiments are directed to a transition structure for interfacing an integrated circuit chip and a substrate, comprising: a microstrip (1010) coupled to a grounded co-planar waveguide structure (1012); a co-planar waveguide structure (1014) coupled to the grounded co-planar waveguide structure (1012), wherein the grounded co-planar waveguide structure (1012) transitions to the co-planar waveguide structure (1014) based on a taper in a signal line and a triangular notch in a ground plane; and balls (1030) of a package coupled to the co-planar waveguide structure (1014). A ground of the microstrip (1010) may be located in a first layer of the transition structure and the signal line may be associated with the microstrip (1010) and a second layer of the transition structure. The package may be a wafer level fan-out package. The transition structure may be configured to operate in accordance with a 60 GHz spectrum.

As described herein, in some embodiments various functions or acts may take place at a given location and/or in connection with the operation of one or more apparatuses, systems, or devices. For example, in some embodiments, a portion of a given function or act may be performed at a first device or location, and the remainder of the function or act may be performed at one or more additional devices or locations.

Embodiments of the disclosure may be implemented using one or more technologies. In some embodiments, an apparatus or system may include one or more processors, and memory storing instructions that, when executed by the one or more processors, cause the apparatus or system to perform one or more methodological acts as described herein. Various mechanical components known to those of skill in the art may be used in some embodiments.

Embodiments of the disclosure may be implemented as one or more apparatuses, systems, and/or methods. In some embodiments, instructions may be stored on one or more computer-readable media, such as a transitory and/or non-transitory computer-readable medium. The instructions, when executed, may cause an entity (e.g., an apparatus or system) to perform one or more methodological acts as described herein. In some embodiments, the functionality described herein may be implemented in hardware, software, firmware, or any combination thereof.

The particular embodiments disclosed above are illustrative only and should not be taken as limitations upon the present disclosure, as the disclosure may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the disclosure as defined by the appended claims so that those skilled in the art should understand that they can make various changes, substitutions and alterations without departing from the spirit and scope of the disclosure in its broadest form.

What is claimed is:

1. A transition structure for interfacing an integrated circuit chip and a substrate, comprising:
a vertical transmission section configured to bridge two layers of a package between two ground planes;
a transmission line formed between the ground planes and connected to a center of the vertical transmission section;
a second vertical transmission section coupled to the transmission line and a layer of the package;
a plurality of solder connections coupled to the layer of the package; and
a microstrip coupled to at least one of the solder connections.

2. The transition structure of claim 1, wherein the microstrip is coupled to the at least one of the solder connections through a grounded co-planar waveguide structure.

3. The transition structure of claim 1, wherein the transmission line comprises a stripline.

4. The transition structure of claim 1, wherein at least one of the vertical transmission section and the second vertical transmission section comprises a quasi-coax section.

5. The transition structure of claim 1, wherein the substrate comprises a printed circuit board.

6. The transition structure of claim 1, wherein the transmission line is configured to convey a signal associated with the integrated circuit.

7. The transition structure of claim 6, wherein the signal is a millimeter wave signal.

8. The transition structure of claim 6, wherein the at least one solder connection is associated with the signal, and wherein the remainder of the solder connections are associated with a ground.

9. The transition structure of claim 1, further comprising:
a via configured to provide a direct current path to ground.

10. The transition structure of claim 1, wherein the chip comprises ground-signal-ground pads that create a co-planar waveguide structure that is continued in a second layer of the package.

11. The transition structure of claim 10, further comprising vias between the second layer and a third layer of the package.

12. The transition structure of claim 1, wherein the microstrip is tapered.

13. The transition structure of claim 1, wherein the package is a low temperature co-fired ceramic package.

* * * * *